United States Patent
Fletcher et al.

[11] 3,950,729
[45] Apr. 13, 1976

[54] SHARED MEMORY FOR A FAULT-TOLERANT COMPUTER

[76] Inventors: James C. Fletcher, Administrator of the National Aeronautics and Space Administration, with respect to an invention of George C. Gilley, Torrance, Calif.

[22] Filed: Aug. 31, 1973

[21] Appl. No.: 393,524

[52] U.S. Cl. .................. 340/172.5; 235/153 AE
[51] Int. Cl.² .................. G06F 11/00; G06F 13/00
[58] Field of Search ........... 340/172.5; 235/153 AE

[56] References Cited
UNITED STATES PATENTS

| | | | |
|---|---|---|---|
| 3,303,474 | 2/1967 | Moore et al. | 340/172.5 |
| 3,517,171 | 6/1970 | Avizienis | 340/172.5 |
| 3,517,174 | 6/1970 | Ossfeldt | 340/172.5 |
| 3,529,141 | 9/1970 | Reed | 235/153 AE |
| 3,566,358 | 2/1971 | Hasbrouck | 340/172.5 |
| 3,573,751 | 4/1971 | DeLisle | 340/172.5 |

*Primary Examiner*—Gareth D. Shaw
*Assistant Examiner*—Melvin B. Chapnick
*Attorney, Agent, or Firm*—Monte F. Mott; Paul F. McCaul; John R. Manning

[57] ABSTRACT

A system for sharing a memory in a fault-tolerant computer. The memory is under the direct control and monitoring of error detecting and error diagnostic units in the fault-tolerant computer. This computer, for example, verifies that data to and from the memory is legally encoded and verifies that words read from the memory at a desired address are, in fact, actually delivered from that desired address. The present invention provides the means for a second processor, which is independent of the direct control and monitoring of the error checking and diagnostic units of the fault-tolerant computer, to share the memory of the fault-tolerant computer and includes circuitry to verify that:

1. The processor has properly accessed a desired memory location in the memory;
2. A data word read out from the memory is properly coded; and
3. No inactive memory was erroneously outputting data onto the shared memory bus.

8 Claims, 4 Drawing Figures

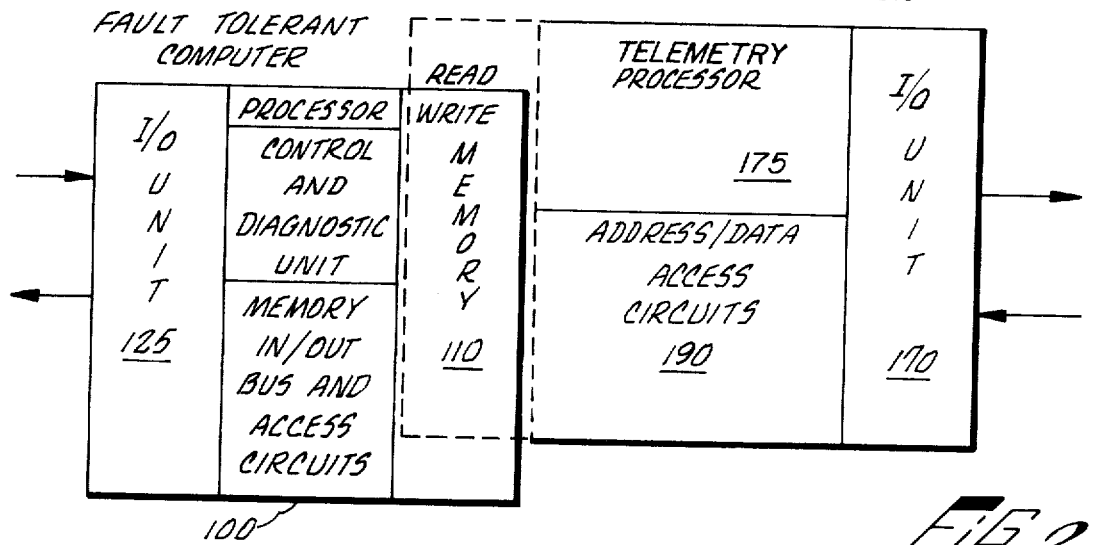
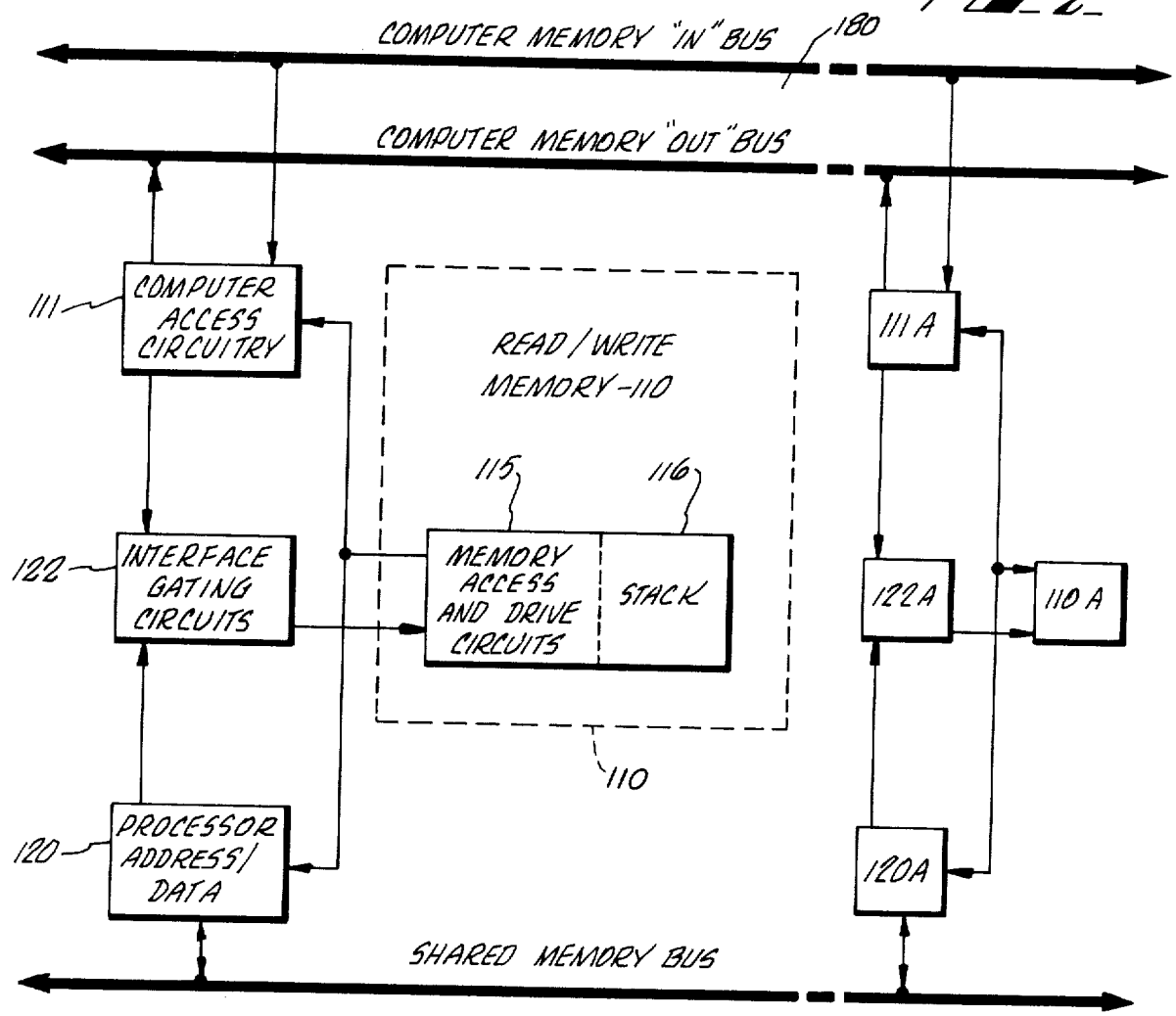

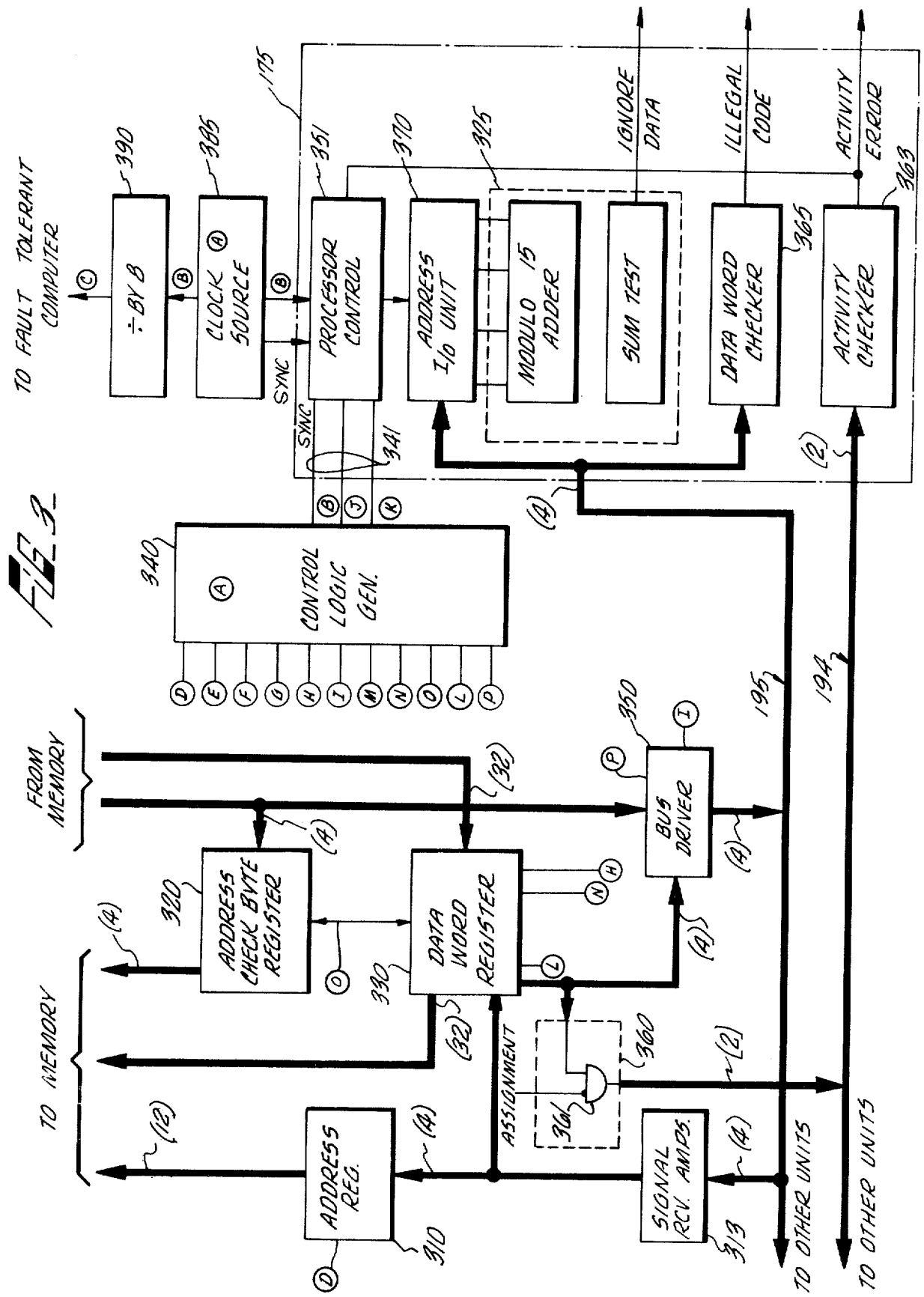

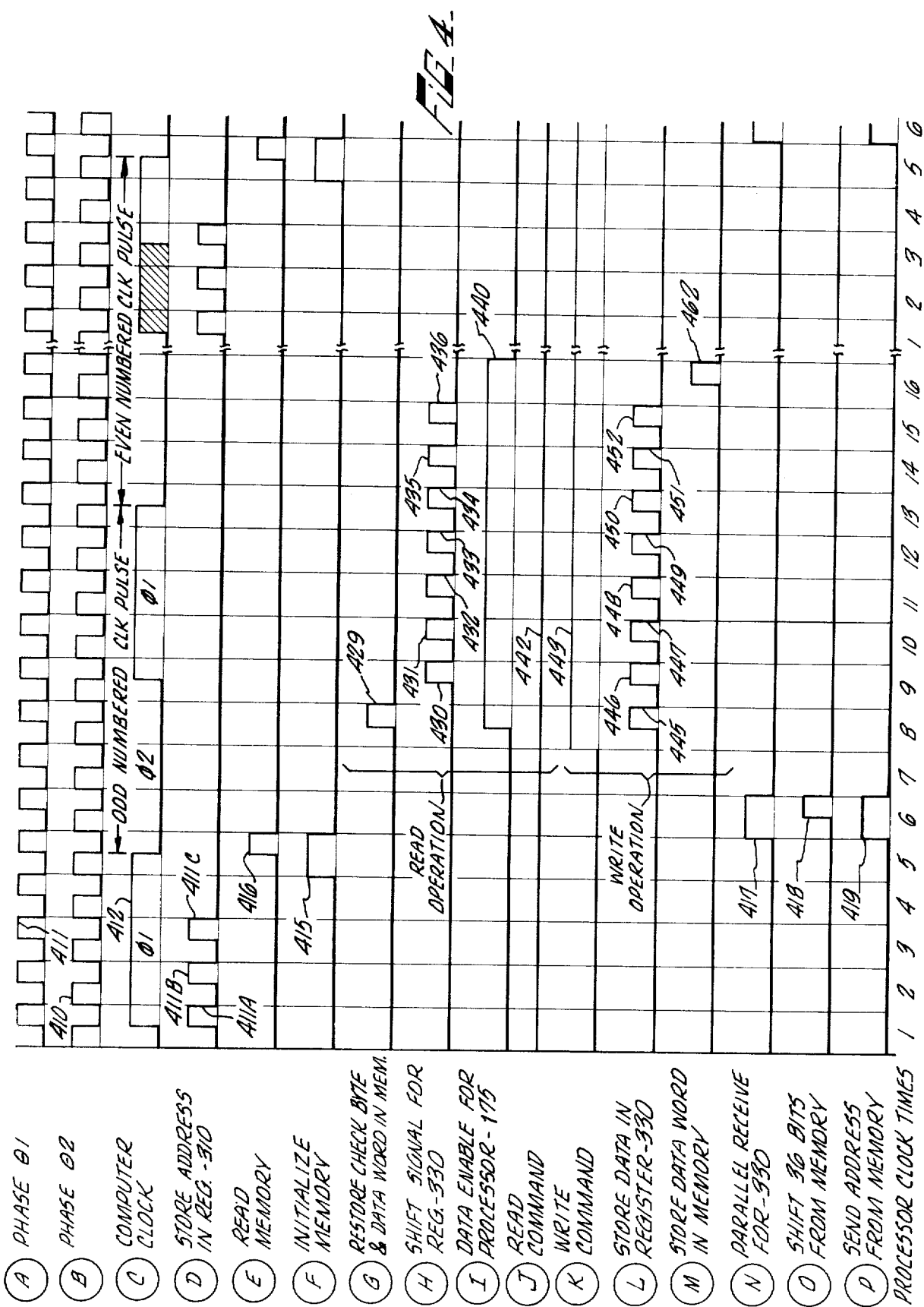

SHARED MEMORY FOR A FAULT-TOLERANT COMPUTER

BACKGROUND OF THE INVENTION

1. Origin of the Invention

The invention described herein was made in the performance of work under a NASA contract and is subject to the provisions of Section 305 of the National Aeronautics and Space Act of 1958, Public Law 85-568 (72 Stat. 435; 43 U.S.C. 2457).

2. Field of the Invention

The invention relates to data processing computers. More particularly, it relates to fault-tolerant computers having a memory which is shared by another processor.

3. Description of the Prior Art

It is known in the prior art to share a memory between two separate computers. These computers of the prior art are of the commercially available type wherein each computer is programmed to acknowledge the fact that a common memory is being shared. Normally, both computers include a common control command sequence which identifies the fact that one of the two computers has seized the memory for its operation. During the period of the time that one computer is using the common memory, the other computer is locked out and can make no use of the common memory. Accordingly, both computers are continually advised that one or the other is using the common memory. Such use does not create any unusual problems because both computers have sufficient flexibility in carrying out their individual programs that the access to a common memory by another computer does not upset either system.

The present invention also relates to sharing a memory by two different computers. The environment of the shared memory, is a fault-tolerant computer. A second computer, or processor, interfaces and accesses the shared memory. The processor is also fault-tolerant but to a more limited degree than that of the fault-tolerant computer to which the memory is assigned.

A fault-tolerant computer is broadly defined as one that continues to operate correctly in the presence of logical errors through the use of protective redundancy in the system. One form of protective redundancy is the replacement system wherein redundant (or spare) units are used to replace operating units which are diagnosed to be faulty. Such a fault-tolerant computer is characterized by its isolation from all electrical contact with any outside data transmission source except for a single input/output unit for the fault-tolerant computer. That particular input/output unit, as well as every operating component of the fault-tolerant computer, is under constant surveillance of the diagnostic circuits of the computer itself to assure continued operation in spite of component or data processing errors.

A typical example of such a fault-tolerant computer together with a thorough description of its operation is set forth in U.S. Pat. No. 3,517,171 issued to A. A. Avizienis on June 23, 1970, the disclosure of which is incorporated herein by reference as though set forth in full. As described in the referenced patent, a control and diagnostic unit in the fault-tolerant computer monitors every functional unit of the computer and monitors step by step every data transfer operation that takes place during the computer operation. If any functional unit in the computer fails, the control and diagnostic unit of the computer detects the failure and a redundant unit is placed into service as a substitute for the failed unit.

Fault-tolerant computers of the replacement system variety are of particular importance in those uses wherein long-life and unattended operation are critical. A typical example is the provision of a fault-tolerant computer for the automatic maintenance of unmanned spacecraft systems for long-life, deep-space missions.

As can well be imagined, the continual step by step fault check, fault detection and error correcting operation of a fault-tolerant computer requires a vast hard-wired program for all elements of the computer. Such a computer is virtually isolated from the outside world in that only one input and one output unit is available and the signals of that input/output unit are also subjected to the fault-tolerant checks and environment.

In spacecraft use, an onboard fault-tolerant computer can be used to monitor the performance of the other spacecraft systems and initiate corrective action if malfunctions are detected. Performance parameters of the spacecraft systems are instrumented with engineering sensors, the output signals of which are fed into the computer through the input/output unit. Diagnostic routines within the fault-tolerant computer utilize the output signals of these sensors to evaluate the performance of the spacecraft systems.

The performance parameters used by the fault-tolerant computer diagnostic routines are the same parameters collected by the flight telemetry system, buffered in a read/write memory, and subsequently transmitted to earth. Therefore, instead of using separate sets of memories (including spares) to satisfy the buffering requirements of the telemetry system and the diagnostic requirements of the fault-tolerant computer, the design of the read/write memories of the fault-tolerant computer can be modified so that each memory module is accessible by both the telemetry system and the fault-tolerant computer.

OBJECTS AND SUMMARY OF THE INVENTION

It is an object of this invention to allow a flight telemetry processor to share read/write memories assigned to the fault-tolerant computer without compromising the fault-tolerant environment of the total system.

It is a further object of this invention to allow the telemetry processor to break through "electrically" into the fault-tolerant computer without compromising its fault-tolerant capabilities.

Although such an electrical breakthrough inherently endangers the fault-tolerant capabilities of the computer, this invention has, as its objective, the provision of a flight telemetry system which is not directly subject to monitoring and command by the control and diagnostic unit of the fault-tolerant computer.

It is a final objective of this invention to provide a processor which operates independently of the fault-tolerant computer and controls its own memory access circuitry and performs address and coding verification of words to and from the memory as well as verifying that no inactive memory is outputting data to the processor.

The novel circuitry of my invention allows the electrical breakthrough in a fault-tolerant computer without upsetting the fault-tolerant capabilities of the computer. The telemetry processor shares the fault-tolerant computer's read/write memory and performs access operations at its maximum rate while the computer performs access at its maximum rate. Both the computer and telemetry processor view the common memory as though it were its own independent memory.

The fault-tolerant computer's checking activities are numerous. In my invention, only three checks are necessary and sufficient to assure the integrity of the shared memory and the processors access circuitry to that memory. In my invention, circuitry is provided to determine that:

1. The processor has properly accessed a desired memory location in the memory;
2. A data word read out from the memory is properly coded; and
3. No inactive memory is erroneously outputting data on the shared memory bus.

BRIEF DESCRIPTION OF THE DRAWINGS

FIG. 1 is a block diagram illustrating the shared memory of a fault-tolerant computer and an independent processor.

FIG. 2 is a block diagram depicting the shared memory and the processor's access means to the shared memory.

FIG. 3 is a combined block and schematic diagram showing circuit details of my invention.

FIG. 4 is a pulse and waveform chart illustrating the timing operations of the circuitry of FIG. 3.

DESCRIPTION OF THE PREFERRED EMBODIMENT

FIG. 1 in block diagram form depicts the environment for the present invention. As shown in FIG. 1, a fault-tolerant computer 100 is provided with one or a multiple of read/write memories 110. A flight telemetry processor 175 shares read/write memory 110 with the fault-tolerant computer 100. The sharing in FIG. 1 is symbolically indicated by the dashed lines.

The fault-tolerant computer 100 may be any fault-tolerant computer similar to the self-testing and repairing computer of the aforementioned referenced patent. Computer 100 is provided with an input/output unit 125 for receiving and transmitting signals to other spacecraft systems. In a similar manner, the telemetry processor 175 is provided with an input/output unit 170 which is capable of receiving outputs from the engineering sensors and sending this data to the spacecraft radio system. The telemetry processor includes shared memory access circuits 190. Circuitry 190 electrically addresses, receives, and transmits information to and from the read/write memory 110 under command of processor 175.

FIG. 2 depicts, in dashed lines, the read/write memory 110 and the fault-tolerant computer access circuitry 111 to that memory. Reference to the aforementioned patent may be made if details to the computer access circuitry 111 is desired. Briefly, however, a read/write memory 110 through interface and access circuits is under control of a processor and a control and diagnostic unit contained in the fault-tolerant computer. The computer utilizes a memory "in" and memory "out" bus 180 to transfer information to and from the memory 110. These memory buses, as a typical example, may each include four separate lines and information is transmitted in bytes of 4 bits per byte with one bit carried on each line of the memory bus. The same data format is utilized in the independent processor address and data transfer circuit 120 for the flight telemetry processor 175.

In the aforementioned fault-tolerant computer, the read/write memory 110 was selected to be of any known type. A multiplicity of such memories are available in the fault-tolerant computer to provide for redundancy. The unique features of this invention require that the fault-tolerant computer memory must be of any known split-cycle type. Such split-cycle read/write memories are well-known in the prior art, and a typical suitable split-cycle memory is identified as the 2650 NANOMEMORY produced and marketed by Electronic Memories, Inc. Such a split-cycle memory is distinguished from a single cycle read/write memory in that, once information is read from the memory, it holds its operation pending further command. Thus, information is not immediately rewritten into the memory address location from which it was read. Instead, in a split-cycle memory, the data is read and held until another command is received. While the data is held, it can be changed or it can be left unaltered. On the write cycle, the same or altered data is, upon a subsequent command, then written into the same address location of the memory.

The memory access and drive circuits 115, of memory 110, are part of the memory as normally provided and need not be shown in any more detail. Such circuits 115 allow data to be read from or stored in the stack portion 116 of the memory 110. These access and drive circuits are available to the processor address and data transfer circuits 120 through interface gating circuits 122. The interface gating circuits 122 may comprise a series of OR gates allowing access to the memory by either the fault-tolerant computer or the independent processor, and thus need not be shown in detail. The block diagram and operation to be described with reference to FIG. 3 is applicable to all of the shared memories such as 110, 110A, and associated equipment bearing similar legends. The description hereinafter, however, is directed to a single memory 110 as shown in FIG. 2 with the understanding that the circuitry and operation is duplicated as many times as is necessary for any particular fault-tolerant environment.

Certain of the elements of FIG. 2 are presented in more detail in FIG. 3. In particular, the telemetry processor address and data transfer circuitry 120 is depicted. Such circuitry includes an address register 310, an address check byte register 320, a data word register 330, a control logic generator 340, bus drive amplifiers 350 and activity error circuitry 360. The double-lined darkened arrows include numbers in parenthesis which indicate the number of lines interconnecting the circuits in a typical and preferred embodiment of my invention.

An address word from the telemetry processor addressing circuit 370 in the form of a 12-bit word is stored in the address register 310 via memory bus 195. This address word from register 310 is applied through the interface gating circuit 122, FIG. 2, to the access and drive circuit 115 of the memory 110, and a standard split-cycle memory access operation is initated. Thus, the access and drive circuits 115 respond to the address and to control signals from logic generator 340 by outputting a 36-bit word from the memory stack 116 from the location of the designated address. The 36-bit word includes a data word (32 bits) for data register 330, and an address check byte (4 bits) for check byte register 320. The address check byte is also transmitted immediately over the shared memory bus 195 to the check byte comparator 325 in the telemetry processor 175. Check byte comparator 325, in any known manner, verifies that the correct memory location in the stack 116 for memory 110 either was, or was not, accessed.

Under control of processor 175, the control logic generator 340 receives a control signal over lines 341 which indicates either a read or a write operation is to be carried out. In this particular example, assume that a read operation is involved. Accordingly, the contents of data register 330 and the address check byte register 320 read from memory will be written into the memory location specified by the address register 310. It should be noted that the exact same memory word is restored in its original location in the memory 110.

Subsequent to restoration of the memory word into the stack 116 of memory 110, FIG. 2, the data word residing in the register 330 is sent, under control of logic generator 340, to the processor 175.

An error checking feature of this invention is involved when the telemetry processor 175 determines that the address forwarded from the address check byte register 320 is incorrect. In such an event, the telemetry processor 175 will emit an ignore data command. Because it is imperative that the same memory word be written back into the exact address from which it was read, the telemetry processor 175, upon detecting an incorrect address, generates a control signal indicative of a read operation. As just described, this procedure results in the data word being restored back into the memory location from which it was received. It is essential that that data word be placed back in the same memory location (even though incorrect) so as to retain the integrity of the data in the memory even though a fault (either transient or permanent) has occurred in the address circuitry. This fault will be diagnosed and corrected either by a retry of the operation or by a replacement of the memory by computer 100 as described in detail in the referenced patent.

A write cycle includes the same steps described hereinbefore with the exception that, once processor 175 determines that the address check byte is correct, a write control signal command is forwarded to the control logic generator 340. During the write operation, a new data word is sent from the telemetry processor 175 to the data register 330. Once the new word is fully stored in data register 330, the control logic generator initiates the second cycle of operation for read/write memory 110. The new data word and the original check byte are thus written into the memory stack at the address location specified by the address stored in address register 310.

Clock pulses, θ2, are generated from a master clock source 385 which is common to both the fault-tolerant computer 100 and the processor 175. These clock pulses are shown in FIG. 4 as waveform 410. Clock pulses θ1, waveform 411, are generated from θ2 by the control logic generator 340 and are used to control the timing of the processor address and data transfer circuit 120. A divide-by-8 circuit 390 is, in a well-known manner, connected to receive pulses θ2 from clock source 385 to provide the clock pulses for the fault-tolerant computer.

As shown in FIG. 4, the beginning of the second half of each even numbered computer clock pulse 412 coincides with the beginning of the second half of the first clock pulse in a telemetry processor access cycle. This timing relationship is established by synchronization in the clock source 385 and assures that the computer clock pulses and the telemetry clock pulses are synchronized. The synchronization of the two clock pulses is important because the fault-tolerant computer accesses the shared memory only during the first part of the second half of its tenth clock pulse time period, as shown in dashed lines at waveform 412. The access time for the computer thus occurs and is completed prior to a time when the telemetry processor requests use of the access drive circuits or the memory stack of the shared memory.

Reference to FIGS. 3 and 4 will now be made to describe the circuit operation in more detail. Processor 175 places a 12-bit address word on memory bus 195 in the form of three 4-bit bytes. Each 4-bit byte is applied over the line receivers 313 to the address register 310. Control logic generator 340 selects from waveform 411 three clock pulses 411A through 411C to strobe and shift each of the bytes into the address register 310 so that all twelve bits are stored in the address register 310. During the fifth clock time, the control logic generator 340 emits two memory access command pulses 415 and 416. Both of these pulses are required by the read/write memory 110 in order to execute, in a known manner, a memory access for a typical split-cycle memory 110. These pulses 415 and 416 for the memory 110 read a 36-bit word from the memory stack 116 via the access and drive circuits 115, FIG. 2. The 36-bit output word is received in parallel by the data register 330 and the address check byte register 320. The 36-bit word is the word that was at the memory location specified by the 12-bit address in the address register 310. Of the 36-bit word, 32 bits comprise the data word from the memory, which data word is read into the data register 330 in parallel fashion. The data register 330 may be of any known type which is adapted to receive data either serially or in parallel depending upon a mode control signal applied to its control inputs. In the example just given, the mode control signal 417 from control logic generator 340 is applied to register 330 during clock period six, and enables the data register 330 to receive data in a parallel mode. The remaining 4 bits from memory 110 are an address check byte. These 4 bits are also read in parallel to the check byte register 320. Since all 36 bits are presented to the two registers simultaneously and in parallel, only a single strobe pulse 418 is required to strobe the 4 and 32 bits respectively into the registers 320 and 330.

The address check byte, in a preferred embodiment, represents the modified modulo-15 residue of the address of that word as it was located in the read/write memory 110. The modified modulo-15 residue checking algorithm is well-known and is a useful error-checking code utilizing a limited number of bits for ready verification whether or not the word was read from the proper address as desired by the initial address stored in 12-bit form at address register 310. Reference to FIG. 4 shows that at the same time that the 4-bit address check byte is applied to the register, the check byte, as a result of signal 419, is applied to the shared memory bus 195 and to processor 175. At the telemetry processor 175, the modified modulo-15 residue checking algorithm is employed by check byte comparator 325. The comparator 325 verifies whether the proper memory location was, in fact, read from the read/write memory 110.

For a read operation, a control signal 429 is sent from the control logic generator to the access and drive circuits of memory 110 during clock pulse time 8. Pulse 429 causes the contents of the data register 330 and the address check byte register 320 to be rewritten into the memory at the address identified by the address register 310. It should be noted that the restoration is done via standard access and drive circuits of the read/write memory. Thus, the data word and the address check byte are still retained in their respective registers 330 and 320.

The telemetry processor 175 receives the 32-bit data word over the four wires of the bus in bytes of 4 bits each. Control signal 440 connects the outputs of register 330 to the shared memory bus 195 and control signals 430 through 436 shift the contents of register 330 onto bus 195 and onto the telemetry processor 175. It was noted hereinbefore that comparator 325 at the telemetry processor 175 checks the address check byte transmitted over the shared memory bus to determine if the correct memory location was addressed. Even if comparator 325 determines from the check byte that an incorrect location has been reached, the process of reading the data word from the data register 330 as just described nevertheless takes place. However, in the telemetry processor 175, an ignore data command is emitted by check byte comparator 325 to indicate that an error has been made and the data word is, therefore, not utilized by the telemetry processor 175.

It should be noted that, in the event that the check byte indicates that an incorrect memory location is accessed, that nevertheless that check byte and the data word were restored by pulse 429 in the read/write memory at the address from which they were read. This unique technique assures the fault-tolerant capabilities of the computer in that the use of the split-cycle read/write memory has allowed the memory to be restored in exactly the same condition as when it was accessed, even though in the assumed example the particular memory location received was not the one, in fact, which was desired. This technique safeguards any loss of information through a transient signal placing an undesired address in one or more of the particular bit locations of the original 12-bit address word.

A write operation differs from the read operation just described in the aspect that a control level from the telemetry processor is sent to the control logic generator 340 immediately following the sixth clock time. This level is used by the control logic generator to differentiate between a read and a write cycle. Thus, the telemetry processor will send, for example, a zero level 442 on one of the control lines 341 to the control logic generator 340 when the read cycle is requested.

In the event that a write cycle is commanded by processor 175, a write control level 443 is delivered to the control logic generator by the telemetry processor prior to the beginning of the second half of the eighth clock time. Thereafter, during clock times 8 through 15, the telemetry processor 175 sends a 32-bit data word to register 330 in the form of eight 4-bit bytes over bus 195. These eight bytes are strobed serially into data register 330 by control signals 445 through 452. After all 32 bits are stored in data register 330, the control logic generator emits store command 462. The store command 462 causes the contents of the data word register 330 and the address check byte register 320 to be written into the memory location specified by the address in the address register 310.

As described for this invention, the read/write memory must be of a split-cycle type. All memory accesses consist of two parts. During the first part, a memory address is delivered to the memory and an initiate pulse 415 and hold pulse 416 are received from the control logic generator. In response to these two memory commands, a 36-bit word is read out of memory and is loaded into the data register 330 and the check byte register 320. At this point during split-cycle operation, the memory will do nothing further until it receives a further command signal such as restore command 429 (or 462). This store command 429 (or 462) together with the appropriate read or write command 442 or 443 control the second part of the split-cycle access. If the read operation, for example, is commanded, telemetry processor 175 delivers a low level 442 to the control logic generator 340 causing restore command pulse 429 to be generated in the eighth clock time. If, on the other hand, the telemetry processor is requesting a write operation, then a write command 443 from the telemetry processor 175 is delivered to the control logic generator 340 immediately after the telemetry logic generator has verified that the check byte is correct. The control logic generator thereafter emits store command pulse 462 during the sixteenth clock pulse time. During clock times 8 through 15, a new 32-bit word is loaded into the data word register 330 from the telemetry processor 175 for storage in memory 110.

The telemetry processor 175 uses the same data format and error checking code as the fault-tolerant computer 110, FIG. 1. As described in the referenced patent, a data word consists of 32 bits as a typical example. These words include 28 bits of data and 4 bits which are the modified modulo-15 residue of the 28-bit binary word. In the fault-tolerant computer, a checking algorithm is employed to determine if a word is "legal", i.e. properly encoded; or if the word is "illegal", i.e. not properly encoded. The computer's checking algorithm, in a manner described in the referenced patent, casts out 15's, that is, it computes the modulo-15 residue of the entire coded word. A properly coded, or legal word, will of necessity have a residue of a given amount, i.e. zero. Thus, a zero sum total (represented by 1111, for example) indicates a correct word. All other residue values indicate an incorrect or illegal word.

The telemetry processor 175 of this invention also checks the legality or illegality of the coded data words by a data word checker 365. The operation of the data word checker is fully described in the referenced patent and need not be repeated here. Briefly, the data word from memory bus 195 is received in checker 365. The modulo-15 residue of the entire coded word is checked. If the word is valid, the processor can employ the data word. The data word checker 365 encodes the data words that the processor 175 stores in the memory 110 by adding the correct modulo-15 check byte to each word stored.

Assume during a read operation that word checker 365 discovers an illegal code. If several retries results in a confirmation that an error other than a transient exists in the encoded data word, processor 175 issues an encoding fault command signal. This signal is sent to the fault-tolerant computer as a fault signal. A fault signal at the input/output unit 120 of the fault-tolerant computer 120 causes an interruption of normal computing and an entry into the recovery mode of operation as fully described for the fault-tolerant computer 100 in the referenced patent. The interruption and recovery operation are fully described in the referenced patent and thus need not be described herein. Suffice it to say that the circuitry of this invention detects an incorrect code and emits an indication of that fault to the fault-tolerant computer 100, FIG. 1. The computer 100 itself will locate and correct for that fault. In such an instance, the telemetry processor 175 would ignore any data word received on the shared memory bus 195, and would send a message to the fault-tolerant computer which would correct the situation by replacing the offending memory.

It was mentioned hereinbefore that in a self-testing and repair computer, it is important to provide several spare read/write memories as redundant units. It is equally as essential to determine that one and only one memory is, in fact, outputting data onto the bus. Activity error logic 360, FIG. 3, is provided in the processor address and data transfer circuit 120 to guarantee proper operation. Two redundant activity checking lines from check logic 360 emit a signal to the activity checker unit 363 at telemetry processor 175 whenever unassigned memory units are erroneously outputting data. This feature is fully described in the referenced patent and thus need not be repeated in detail herein. Suffice it to say that the fault-tolerant computer 100 assigns one memory to be a shared memory. That assignment includes placing an inhibit term on a pair of gates 361 (only one of which is shown) within activity logic 360. All of the other activity logic assigned to other memories do not have an inhibit term placed on their associated logic gates because these memories are not assigned as active shared memories. Accordingly, the presence of any signals on activity error bus 194 is detected by activity checker 363 at processor 175 as a signal that is indicative of an unassigned memory outputting data. Such a signal means that an unassigned memory is polluting the shared memory bus 195. In such an event, the activity checker 363 will emit an activity error signal to the self-testing and repair computer 100. The processor 175 will then abort any memory access already under way, and perform a sufficient number of retries. If the retries are unsuccessful because of illegal bus activity, the processor 175 will notify the computer 100 which will then remove power from the offending memory.

While a preferred embodiment of the present invention has been described hereinabove, it is intended that all matter contained in the above description and shown in the accompanying drawings be interpreted as illustrative and not in a limiting sense and that all modifications, constructions, and arrangements which fall within the scope and spirit of the invention may be made.

What is claimed is:

1. A system including a fault-tolerant computer containing a split-cycle read/write memory directly controlled and monitored by an error detecting and diagnostic unit, said computer including means for verifying that data passing between said computer and said memory is correctly encoded, the system further comprising:

a processor means, independent of the direct control of the error checking and diagnostic unit of said fault-tolerant computer, for processing information independent of said fault-tolerant computer;

access means responsive to said processor means for reading and writing data from and into said read/write memory at times when said computer does not have access to said memory;

data bus means for carrying data between the processor and said access means;

means controlled by said processor for monitoring the memory words exchanged between said processor and said memory and verifying that such words are correctly encoded; and means for transmitting a fault-indicating signal from said monitoring means to said fault-tolerant computer, when said monitoring means detects an incorrectly encoded memory word.

2. The system in accordance with claim 1 wherein the words stored in said memory include address verification check bytes and said system further comprises:

means for reading a word from said memory at a desired address; and means for comparing the check byte and the desired address and indicating whether the correct address was accessed in said memory.

3. A system in accordance with claim 2 and further comprising:

means responsive to an incorrect address indication from said address check byte comparator for rewriting the word including the address check byte back into the same memory location from which it was read.

4. A system in accordance with claim 1 wherein said computer comprises more than one memory with one only being active at a given time as a shared memory, said system further comprising:

logic means connected to said processor access means for initiating a signal indicative that an inactive memory is outputting data.

5. A system including a fault-tolerant computer having a split-cycle read/write memory wherein the words stored in said memory include address verification check bytes, said system further comprising:

a processor means, sharing said memory, for processing information independent of said fault-tolerant computer;

means independent of said computer for reading a word from said memory at a desired address;

means utilizing the check byte of the word read from memory for determining that the desired memory location was addressed, and initiating a signal to said fault-tolerant computer indicative of an incorrectly addressed word whenever an erroneous memory location is determined; and means responsive to said check byte utilizing means for rewriting the word, including the check byte, back into the same memory location from which the word was read.

6. A system in accordance with claim 5 wherein said split-cycle read/write memory responds to an input address by reading a word from the addressed memory location and holding its operation until commanded further, said system further comprising:

a check byte register connected to said memory for storing an address verification check byte read from said memory;

a data register connected to said memory for storing the word read from memory;

means for applying a new data word from the processor to said data register; and control logic means for applying a write command to said memory to store the check byte and the new data word in the memory.

7. A system including a fault-tolerant computer containing a split-cycle read/write memory, wherein the computer also includes means responsive to a command signal indicative of an improperly coded data word read from said memory for testing and repairing components that may have resulted in said improperly coded data word, said system further comprising:

a processing, independent of said fault-tolerant computer addressing said memory at times when said computer does not have access to said memory for processing 8. In a system including a fault-tolerant computer, means for determining when data words read from a memory are incorrectly encoded or incorrectly addressed, and means responsive to said determining means for replacing or otherwise repairing the faulty memory, the improvement therein, comprising:

a read/write memory for the computer, said read/write memory being of the split-cycle access type;

a processor means independent of said computer for sharing said memory with said computer at times when said computer does not have access to said memory;

control logic means in said processor means for causing delivery of an address and a read command to said memory during the first part of the cycle for said memory;

an address register means for receiving an address signal for a desired location in said memory;

a data register means for receiving information read from said memory which information includes a check byte indicative of the address from which the information is being read;

an address check byte register means for receiving from said memory, said byte of information indicative of the address location of said memory that was actually addressed;

means in said process for verifying whether the correct address location was accessed; and means responsive to said address vertification means and controlled by said control logic generator for rewriting during the second part of the cycle for said memory at the stored address information stored in said data register in the event an address other than said desired address was accessed.

* * * * *